US010389123B2

(12) United States Patent
Saers et al.

(10) Patent No.: US 10,389,123 B2
(45) Date of Patent: Aug. 20, 2019

(54) POWER CONTROL OF MICROGRID WHEREIN DETECTING A NEED FOR OVERLOADING A TRANSFORMER BASED ON POWER BALANCE WITHIN THE MICROGRID

(71) Applicant: ABB Schweiz AG, Baden (CH)

(72) Inventors: Robert Saers, Västerås (SE); Ritwik Majumder, Väterås (SE); Antonis Marinopoulos, Alkmaar (NL)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/071,769

(22) PCT Filed: Mar. 3, 2016

(86) PCT No.: PCT/EP2016/054553
§ 371 (c)(1),
(2) Date: Jul. 20, 2018

(87) PCT Pub. No.: WO2017/148520
PCT Pub. Date: Sep. 8, 2017

(65) Prior Publication Data
US 2019/0027932 A1    Jan. 24, 2019

(51) Int. Cl.
*G05D 17/00* (2006.01)
*H02J 3/06* (2006.01)
(Continued)

(52) U.S. Cl.
CPC ............ *H02J 3/06* (2013.01); *G01R 19/2513* (2013.01); *G01R 31/027* (2013.01);
(Continued)

(58) Field of Classification Search
CPC .......................................................... H02J 3/14
(Continued)

(56) References Cited

U.S. PATENT DOCUMENTS 7,313,465 B1 * 12/2007 O'Donnell ............. G06Q 50/06
700/291
8,019,697 B2 * 9/2011 Ozog ............... G06Q 10/06315
705/412

(Continued)

FOREIGN PATENT DOCUMENTS

DE   102012025178 A1   5/2014
WO     2012096564 A1   7/2012
(Continued)

OTHER PUBLICATIONS

Brissette et al, A Microgrid Modeling and Simulation Platform for System Evaluation on a Range of Time Scales, 2011, IEEE (Year: 2011).*

(Continued)

*Primary Examiner* — Suresh Suryawanshi
(74) *Attorney, Agent, or Firm* — Whitmyer IP Group LLC

(57) ABSTRACT

A method for controlling power in a microgrid that includes power sources, loads and at least one connection to a main grid where a transformer is arranged to transfer electric power between the microgrid and the main grid is disclosed. The method includes: monitoring the power balance within the microgrid; monitoring the transformer, including monitoring the transformer temperature; and detecting a need for overloading the transformer based on the power balance within the microgrid. Especially, the method includes: determining a load profile for the transformer based on the power balance within the microgrid; determining a prognosis of the transformer temperature based on the load profile; and determining a schedule for power control of the microgrid, which determining of a schedule for power control includes analyzing the prognosis of the transformer temperature.

17 Claims, 3 Drawing Sheets

(51) Int. Cl.

| | | |
|---|---|---|
| *H01F 27/00* | (2006.01) | |
| *H02J 3/38* | (2006.01) | |
| *G01R 19/25* | (2006.01) | |
| *G01R 31/02* | (2006.01) | |
| *G05B 13/04* | (2006.01) | |
| *H02J 3/14* | (2006.01) | |
| *H02J 3/00* | (2006.01) | |
| *G05B 19/042* | (2006.01) | |

(52) U.S. Cl.
CPC ......... *G05B 13/041* (2013.01); *H01F 27/008* (2013.01); *H02J 3/14* (2013.01); *H02J 3/38* (2013.01); *G05B 19/0428* (2013.01); *H02J 2003/003* (2013.01); *H02J 2003/007* (2013.01); *Y02E 60/76* (2013.01); *Y02P 80/14* (2015.11); *Y04S 40/22* (2013.01)

(58) Field of Classification Search
USPC ........................................................ 700/295
See application file for complete search history.

(56) References Cited

U.S. PATENT DOCUMENTS

| | | | | |
|---|---|---|---|---|
| 8,509,976 | B2* | 8/2013 | Kempton | B60L 53/665 701/22 |
| 8,731,729 | B2* | 5/2014 | Blevins | H02J 3/005 700/291 |
| 8,831,788 | B2* | 9/2014 | Flynn | H02J 3/383 700/286 |
| 8,890,505 | B2* | 11/2014 | Forbes, Jr. | G06Q 10/00 323/318 |
| 2009/0125351 | A1* | 5/2009 | Davis, Jr. | G06Q 20/027 705/79 |
| 2011/0282508 | A1 | 11/2011 | Goutard et al. | |
| 2012/0061964 | A1 | 3/2012 | Kirchner | |
| 2012/0226386 | A1 | 9/2012 | Kulathu et al. | |
| 2013/0015703 | A1* | 1/2013 | Rouse | H02J 3/38 307/18 |
| 2013/0035800 | A1 | 2/2013 | Kulathu et al. | |
| 2014/0018969 | A1* | 1/2014 | Forbes, Jr. | H02J 3/32 700/295 |
| 2014/0039710 | A1 | 2/2014 | Carter et al. | |
| 2014/0058571 | A1* | 2/2014 | Hooshmand | G05B 15/02 700/286 |
| 2014/0297206 | A1 | 10/2014 | Silverman | |
| 2015/0039145 | A1* | 2/2015 | Yang | G05B 13/02 700/291 |
| 2015/0233997 | A1 | 8/2015 | Atkinson | |
| 2016/0233682 | A1* | 8/2016 | Do Rosario | H02J 3/387 |
| 2016/0313716 | A1* | 10/2016 | Chen | H02J 4/00 |

FOREIGN PATENT DOCUMENTS

| | | |
|---|---|---|
| WO | 2012106389 A2 | 8/2012 |
| WO | 2015042793 A1 | 4/2015 |

OTHER PUBLICATIONS

International Preliminary Report on Patentability, Application No. PCT/EP2016/054553, dated Feb. 2, 2018, 7 pages.
International Search Report and Written Opinion of the International Searching Authority, Application No. PCT/EP2016/054553, completed: Oct. 27, 2016; dated Nov. 4, 2016, 13 pages.
Office Action from Australia, Application No. 2016395961, dated Aug. 22, 2018, 12 pages.
Carne, G. D. et al: "Frequency-Based Overload Control of Smart Transformers", 2015 IEEE Eindhoven Powertech, Eindhoven, Netherlands, Jun. 29-Jul. 2, 2015: pp. 1-6.
Katiraei, F. et al: "Microgrids management-Controls Aspects of Microgrids", IEEE Power and Energy Magazine, vol. 6 Issue 3, May-Jun. 2008: pp. 54-65.
Nejabatkhah, F. et al: "Overview of Power Management Strategies of Hybrid AC/DC Microgrid", IEEE Transactions on Power Electronics, vol. 30, No. 12, Dece. 2015: p. 1.
Zakariazadeh, A. et al: "Smart Microgrid Energy and Reserve Scheduling with Demand Response Using Stochastic Optimization", Electrical Power and Energy Systems 63, (2014): pp. 523-533.

* cited by examiner

POWER CONTROL OF MICROGRID WHEREIN DETECTING A NEED FOR OVERLOADING A TRANSFORMER BASED ON POWER BALANCE WITHIN THE MICROGRID

TECHNICAL FIELD

The invention relates to power control of an electric power grid. Especially, the invention concerns microgrids connected to a main grid by at least one transformer, wherein the transformer is used for transferring power between the microgrid and the main grid and where the transformer may be temporarily overloaded when the need for power transfer through the transformer exceeds the rated power level of the transformer.

BACKGROUND

Patent application document US 2011/0282508 (D1) describes a system for control of a power grid (PTDG in D1). The system may control the power in the grid by means of for example a substation and a transformer (see claim 1 of D1). The system is aimed at identifying operational states of equipment, identify abnormal conditions and select actions to be taken (see claims 2-4 of D1). The system is further configured to perform simulations of at least a part of the power grid (PTDG) (see claim 6 of D1), and use criteria for selecting actions in order to modify the operation of equipment of the power grid (see claim 7 of D1). The system is provided to operate equipment in an overloaded condition. For example, the system can receive a request for overload of a transformer, from a grid operator, and perform a simulation to determine whether or not the request can be granted (see § 0071 of D1). In order to perform such a simulation, the system includes a transformer monitoring system (see § 0016 of D1) and may determine the health of the transformer (§ 0064), and perform a diagnosis of the transformer (§ 0067). As a result of monitoring and diagnosis, the system may also determine that service or maintenance is needed.

SUMMARY

An aim of the invention is to seek an optimal loading of a transformer arranged between a microgrid and a main grid, when overloading of the transformer is possible, in order to provide a temporary power balance within the microgrid.

According to a first aspect, the present invention provides a method for controlling power in a microgrid that comprises power sources, loads and includes at least one connection to a main grid where a transformer is arranged for transferring electric power between the microgrid and the main grid. The method is preferably performed in a control system of the microgrid and comprises:

monitoring the power balance of the microgrid,
monitoring the transformer, including monitoring the transformer temperature,
detecting a need for overloading the transformer based on the power balance of the microgrid.

The method is characterized in comprising:
determining a load profile for the transformer based on the power balance of the microgrid,
determining a prognosis of the transformer temperature based on the load profile,
determining a schedule for power control of the microgrid, which determining of a schedule for power control includes analyzing the prognosis of the transformer temperature.

Using a load profile that indicates time-dependent power levels for the transfer through the transformer is a reliable and un-complicated way to predict the future temperature of the transformer. The analyzing of the prognosis of the transformer temperature provides valuable input in selecting a schedule for power control that avoids overheating the transformer.

In an embodiment, the method further comprises:
performing an optimization of the schedule for power control by repeatedly:
determining an updated load profile for the transformer based on the schedule for power control, especially the schedule for power control may be used for estimating the future power balance of the microgrid and thus provide an estimation of the future load of the transformer,
determining an updated prognosis of the transformer temperature based on the load profile, and
determining an updated schedule of power control within the microgrid.

In an embodiment, the optimization of the schedule for power control includes seeking a power control schedule that
a) maximizes the power transfer through the transformer,
b) avoids tripping the transformer, and
c) avoid power imbalance within the microgrid to keep the system voltage and frequency, within acceptable limits. Thus, the voltage and frequency should comply with the nominal voltage and nominal frequency within predefined limits.

In this way, the method will provide an iterative process for finding an optimal balance between power transfer and temperature of the transformer. Such an iterative process is comparably un-complicated in relation to a full simulation of the microgrid and the grid connected transformer.

In an embodiment, the optimization of the schedule for power control includes prioritizing storing of energy in energy storages in relation to decreasing power production, and includes prioritizing decreasing power production in relation to tripping the transformer, especially when the microgrid exports power.

Storing excess energy is economically advantageous, especially when utilizing renewable power. When the storing capacity is, or becomes lower, the power production may be decreased, preferably the power production from fossil fuel power sources, while keeping renewable power sources at their maximum power output. Thus, prioritizing renewable power sources in relation to fossil fuel sources. Also, reconnection of previously disconnected loads can be prioritized before disconnection of a power source, especially disconnecting of a renewable power source.

In an embodiment, the monitoring of the transformer includes monitoring the cooling of the transformer, such as status of cooling equipment, available cooling power of cooling equipment and surrounding temperature of the transformer, and possibly also a forecast for the surrounding temperature.

In an embodiment, the prognosis of the transformer temperature includes a time left before reaching a tripping condition of the transformer, or wherein the analyzing of temperature prognosis, includes identifying a time left before reaching a tripping condition of the transformer. This time may then be used to control the microgrid assets and load controllers for power management within the microgrid. Information on a time to trip is valuable in order to determine a schedule for power control that includes actions that will postpone tripping of the transformer further into the future.

In an embodiment, the method includes determining if overloading is possible before determining a schedule for power control, which determining if overloading is possible preferably includes sending an initial request for overloading to a transformer controller and receiving an acknowledgement from the transformer controller.

In an embodiment, the method further includes controlling cooling of the transformer based on:
the level of power transferred through the transformer, or the load profile.

Controlling the cooling of the transformer based on the power level or the load profile is advantageous compared to controlling the cooling based on the temperature, since the rise in temperature is delayed compared to a rise of the power level. Especially advantageous is to use the load profile for controlling the cooling since the load profile includes information of future power level, and makes it possible to also to lower the temperature of the transformer before the temperature starts to increase as a consequence of increasing the power levels. Cooling in advance may be used to postpone overheating of the transformer.

According to a second aspect, the present invention provides a microgrid controller, for controlling power in a microgrid that comprises power sources, loads and includes at least one connection to a main grid where a transformer is arranged to transfer electric power between the microgrid and the main grid. The microgrid controller is configured to monitor the power balance within the microgrid, and detect a need for overloading the transformer based on the power balance within the microgrid.

Especially, the microgrid controller is configured to:
determine a load profile for the transformer based on the power balance within the microgrid,
obtain a prognosis of the transformer temperature based on the load profile,
analyze the prognosis of the transformer temperature to determine a schedule for power control of the microgrid, and
control the power supply from the power sources and power supplied to the loads in accordance with the power control schedule.

In an embodiment of the second aspect, the microgrid controller is further configured to optimize the schedule for power control by repeatedly:
determine an updated load profile for the transformer (4) based on the schedule for power control,
determine an updated prognosis of the transformer temperature based on the load profile, and
use the updated prognosis of the transformer temperature to update the schedule of power control.

According to a third aspect, the present invention provides a control system for controlling power in a microgrid that comprises power sources, loads and includes at least one connection to a main grid where a transformer is arranged for transferring electric power between the microgrid and the main grid. The control system comprises a microgrid controller and a transformer controller and the control system is configured to perform the method of the first aspect of the invention.

BRIEF DESCRIPTION OF THE DRAWINGS

Embodiments of the invention will be described with references to the accompanying drawings wherein.

DETAILED DESCRIPTION

The present invention concerns microgrids, and especially power control of a microgrid where a transformer that connects the microgrid to a main grid may temporarily be overloaded, i.e. the transformer is used for transferring power above its rated power. Such microgrids may be provided in many different topologies, having a varying number of loads and power sources and one or more connections for the transfer of power to and from one or more main grids.

Figure 1:
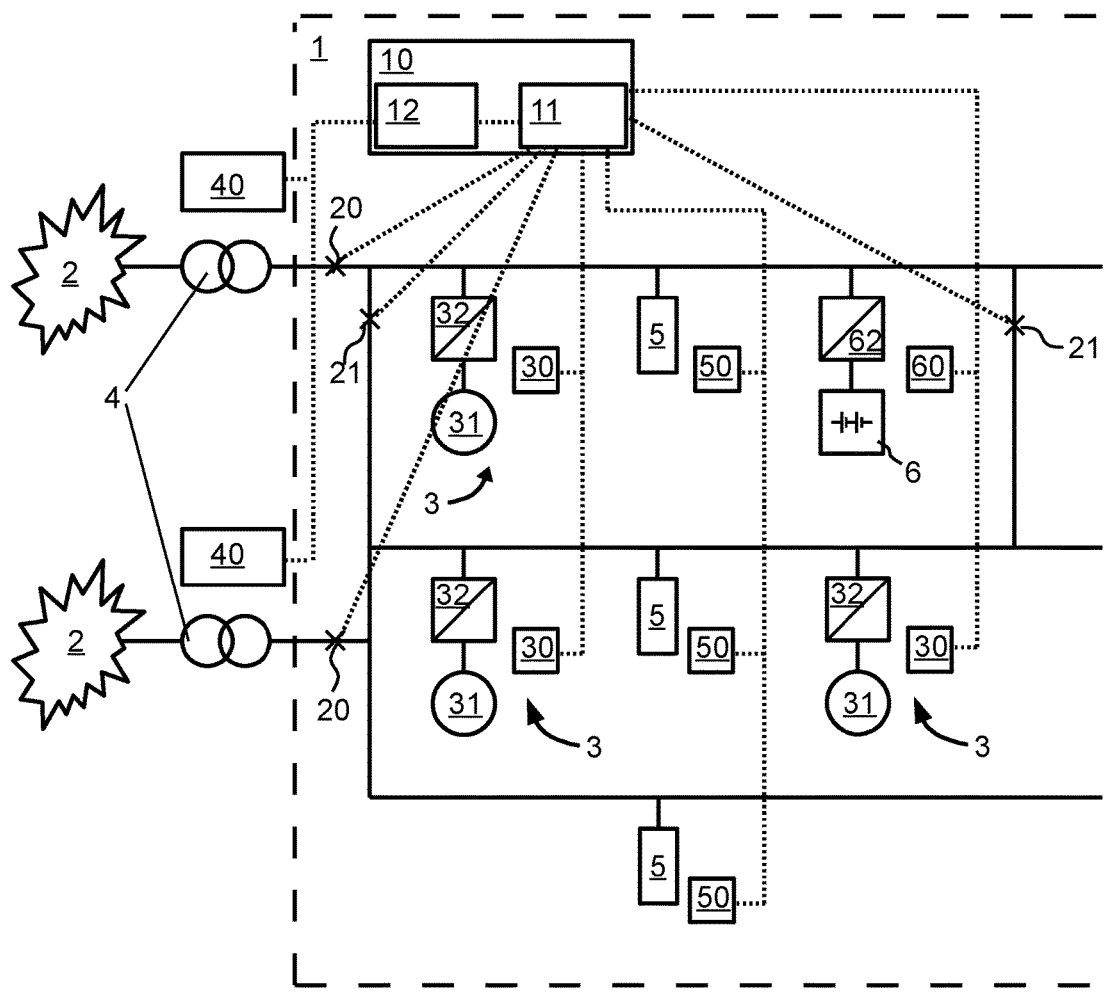
FIG. 1 illustrates a microgrid.

FIG. 1 illustrates an example of such a microgrid 1 connected to at least one main grid 2, exemplified in FIG. 1 as two main grids 2. The connection between the microgrid 1 and each main grid 2 comprises a transformer 4, and a breaker 20 for selectively connecting and disconnecting the microgrid 1 to each respective main grid 2.

The microgrid 1 comprises power sources 3, loads 5, breakers 20, 21 and an energy storage 6. The microgrid 1 also comprises a microgrid controller 10 for controlling the equipment of the microgrid 1, such as monitoring and controlling the power received from the power sources 3, the power supplied to the loads 5 and the power supplied to, and received from, the energy storage 6 and also for controlling switches/breakers (not illustrated) for connection and disconnection of the power sources 3, loads 5 and the energy storages 6.

Each power source 3 includes a distributed generator 31 and a converter 32, such as an AC/AC converter or an AC/DC inverter, for converting the power from the distributed generator 31 to the power type and level of the microgrid 1. The microgrid 1 may also include power sources (not illustrated) that are connected directly, or via a transformer, to the microgrid, such as hydro plants or diesel engines. Each power source 3 is also provided with a power source controller 30 for controlling the distributed generator 31 and the converter 32. Each power source controller 30 of the power sources 3 is communicatively connected to the microgrid controller 10 whereby the microgrid controller 10 may control and monitor the power sources 3.

Similar to the power sources 3, each load 5 is also provided with a load controller 50 that is communicatively connected to the microgrid controller 10. The energy storage 6, exemplified as a DC storage, is connected to the microgrid 1 by means of an AC/DC inverter 62, and is also provided with an energy storage controller 60 that is communicatively connected to the microgrid controller 10. The energy storage 6 may for example be a DC battery or capacitor storage, or alternatively a fly-wheel storage providing AC power, in which case the fly wheel storage is connected to the microgrid 10 by means of AC/AC converter means.

The microgrid 1 is also provided with switches 21 for selectively separating the microgrid 1 into two sub-grids. The microgrid 1 may be provided with further switches (not illustrated) for selectively separating the microgrid 1 into three or more sub-grids. However, the present invention may be provided in microgrids 1 lacking this feature of separation into sub-grids.

Each transformer 4 is provided with a transformer controller 40 for monitoring the transformer 4, such as monitoring the temperature of the transformer 4, the power transfer between the main grid 2 and the microgrid 1, and cooling equipment (not illustrated) for cooling the transformer 4 The transformer controller 40 is preferably configured to control the cooling equipment. The transformer 40 is also configured for communication and is communicatively connected to the microgrid controller 10.

The microgrid controller 10 is exemplified as comprising two main control parts; a power balance controller 11 and a transformer overload controller 12. The power balance controller 11 is adapted for the monitoring and control functions of the microgrid 1, especially for monitoring the power balance within the microgrid 1. The transformer overload controller 12 is configured for controlling overloading operations of the transformer 4, especially when the nominal power transfer through the transformer 4, i.e. the rated power of the transformer 4, is not sufficient for providing a suitable power balance within the microgrid 1. The transformer overload controller 12 is configured to use data provided by the power balance controller 11 and data provided by the transformer controller 40.

When configuring a microgrid, the transformer arranged for transfer of power to and from a main grid is selected so that the rated power of the transformer is high enough for the expected power transfer between the main grid and the microgrid. However, the number of loads and power sources of a microgrid may subsequently be changed, for example by adding power sources and/or loads. The rated power of the transformer may then become too low for the power transfer needed. FIG. 1 can be seen as illustrating such a case, wherein to enhance the power transfer capability to and from a microgrid 1, the microgrid 1 has been provided with a connection to a second main grid 2, by means of a second transformer 4. In practice, the microgrid 1 may instead be provided with a second connection, comprising a transformer 4, to the original main grid 2. Thus, to provide adequate power transfer capability to and from the microgrid 1 of FIG. 1, the microgrid is connected by means of two transformers to one or two main grids 2. The rated power of these transformers 4 have been selected to provide enough power transfer capacity for the power exchange between the microgrid 1 and the main grid 2. The present invention is aiming at handling situations when the power transfer, at the rated power level of the transformer 4, between a main grid 2 and a microgrid 1 is not sufficient for the power sources 3 and/or the loads 5 of the microgrid 1, i.e. not sufficient for providing a power balance between the power transfer to or from the main grid 2, the power supplied by the power sources 3 and the electric power consumed by the loads 5. Such a situation may arise in case one of the transformers 4 configured for the power transfer for some reason has been disconnected. Another such situation may arise if the number or capacity of the power level of the power sources and/or the loads has been increased without increasing the power transfer capacity of the transformer 4 that interconnects the microgrid 1 and the main grid 2, and the power production e.g. is unusually high or low.

The microgrid controller 10 is configured to monitor the power balance within the microgrid, including power transferred through the transformer 4. If the need for power transfer to upheld the current balance of power supplied and consumed within the microgrid 1 is larger than the rated power level of the transformer 4, then the microgrid controller 10 is configured to determine if overloading of the transformer 4 is possible. When overload is possible, the microgrid controller 10 is configured to include the status of the transformer 4 when seeking a power balance within the microgrid 1. Including the status of the transformer 4 when seeking power balance may be provided in accordance with the invention in different ways. In an embodiment, the microgrid controller 10 communicates with the transformer controller 40 and receives information about the transformer 4 status, such as the temperature of the transformer, and the status of cooling equipment of the transformer 4. The microgrid controller 10 is configured to provide a prognosis of the transformer 4 temperature, which is subsequently used for planning the balancing of power within the microgrid 1. In another embodiment, the transformer controller 40 provide the temperature prognosis and send the prognosis to the microgrid controller 10, which uses the temperature prognosis of the transformer 4 for planning for power balance, such as scheduling actions to control the equipment, for example regulating power levels of any of the power sources 3 or storing power in, or injecting power from the energy storage 6, or disconnecting loads 5.

Embodiments of the methods for controlling the power in the microgrid 1 will be described with reference to FIGS. 2 and 3. The method steps may be performed in a control system for a microgrid 1, or in cooperation with a control system for a microgrid 1, such as cooperation of the transformer controller 40 and the microgrid controller 10, including the transformer overload controller 12 and the power balance controller 11. Some steps may also, alternatively or additionally, be performed in a control system of the main grid 2, such as for example determining a prognosis for the transformer 4 temperature, which prognosis subsequently is transferred from the main grid 2 control system and received, and used, by the microgrid controller 10.

Figure 2:
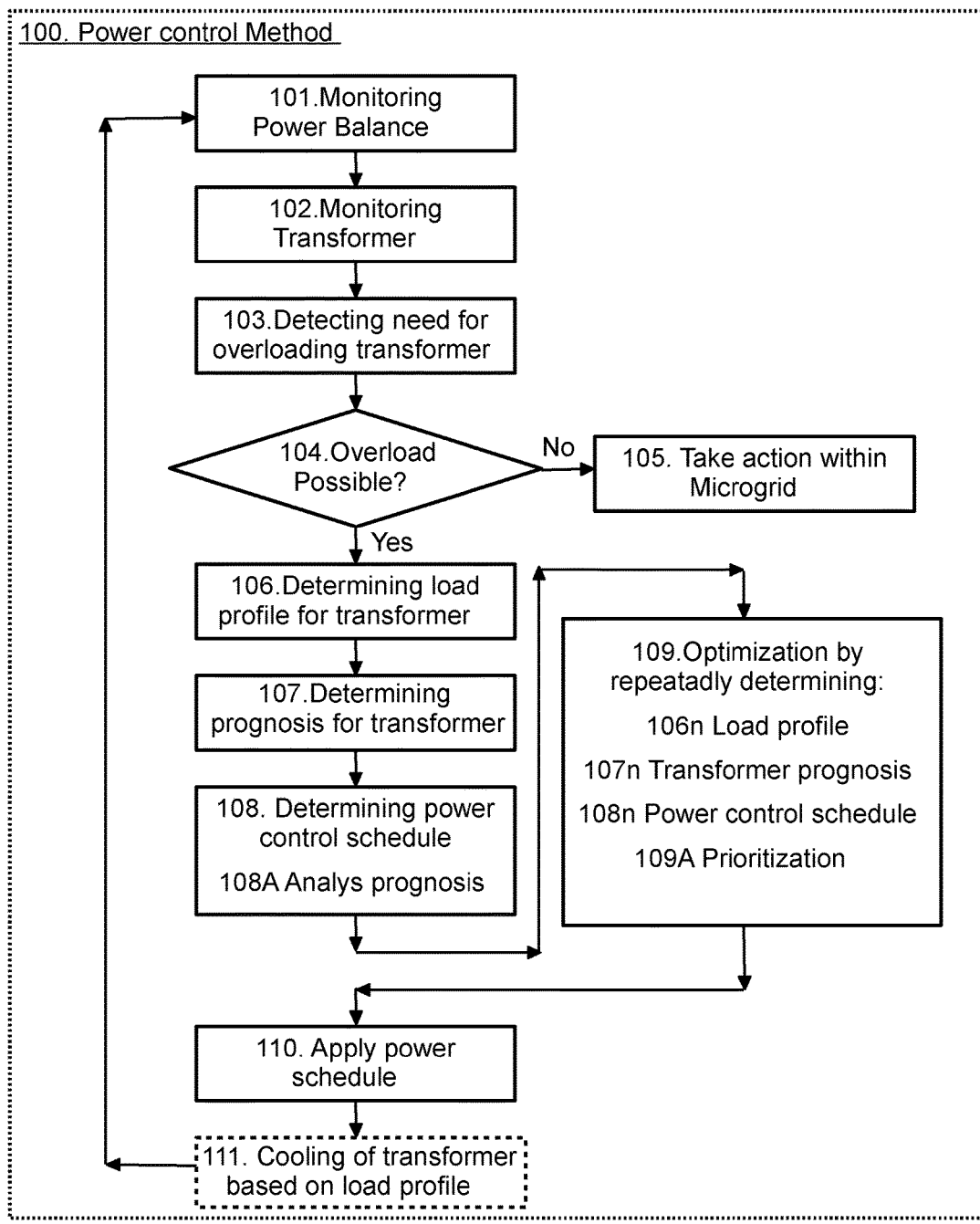
FIG. 2 illustrates a method for controlling power in a first embodiment.

In the power control method 100 for a microgrid illustrated in FIG. 2, the power balance within the microgrid is monitored and the transformer 4 is monitored, and the monitoring of the power balance and transformer 4 may be performed during the whole process, including repeatedly updating measurements and calculated data. Thus, the method includes monitoring 101 of the electric power balance, wherein the electric power supplied within the microgrid 1, the electric power consumed within the microgrid and the electric power exported, or imported, through the transformer 4, or transformers 4, are monitored. Power balance should be achieved at the nominal voltage and frequency level of the microgrid. The method further includes monitoring 102 the transformer 4, especially the temperature of the transformer. Thus, the method monitors the power through the transformer 4 and the temperature of the transformer 4.

The method further comprises determining 103 whether there is a need for overloading the transformer 4, e.g. detecting if power transfer at the rated power of the transformer 4 is not enough for providing a power balance in the current state within the microgrid 1. A change in power balance may occur due to a disconnection or connection of any of the power sources 3, loads 5 and/or connections to the main grid 2.

The method further comprises determining 104 if overloading of the transformer 4 is possible. If not, the method continues with taking action 105 by controlling the resources of the microgrid 1, including regulating the power supplied by the power sources 3, shedding one or more of the loads, storing energy in the energy storage and/or injecting energy from the energy storage. If overloading of the transformer 4 is possible, at least temporarily, the method continues with steps 106, 107, 108, 109 in order to optimize the power control of the microgrid 1 in view of the overloading capacity of the transformer 4.

Upon determining 103 a need for overloading of a transformer 4, the method may include measures for increasing the cooling effect on the transformer 4, such as starting fans arranged for cooling, or increasing the cooling effect of cooling radiators arranged at the fans and/or for oil-filled transformers increasing the cooling power by means of pumps circulating the transformer oil.

The optimization steps 106, 107, 108, 109 start with determining 106 a load profile for the transformer 4. The load profile comprises levels of the power transfer through the transformer 4 that is needed during a time period extending into the future. The load profile is provided from knowledge of the power balance within the microgrid 1 and knowledge of the future power balance within the microgrid, and may initially be a constant power level. Future knowledge may for example include information about disconnection or regulation of loads, which loads may be varying over time in a predictable manner, and for example information about power sources used in the microgrid that vary over time, such as power sources that include photovoltaic solar panels or wind turbines. Planned use of a power source 3, a load 5 or of the energy storage 6 may also provide knowledge for forecasting the future need for power transfer through the transformer 4.

The next step uses the load profile of the transformer to determine 107 a prognosis for the temperature of the transformer 4. The determining 107 of a prognosis of the transformer temperature 4 may also be based on the temperature of the transformer and the status of the cooling means of the transformer, such as including the surrounding temperature of the transformer 4 and available power of cooling equipment of the transformer 4.

The temperature profile obtained is used in the subsequent step of determining 108 a power control schedule for the microgrid 1. The power control schedule will include regulating the power within the microgrid 1, such as load shedding, energy storing/injecting etc. The determining 108 of a power control schedule includes analyzing 108A the temperature prognosis and selecting regulation actions to be taken in the microgrid 1 in order to avoid overheating of the transformer 4, such as avoiding negatively affecting the transformer 4 by subjecting the windings of the transformer 4 to high temperatures and/or hot-spots. The analysis 108A of the temperature profile may suitably comprise identifying risks for overheating the transformer 4 and the time left, or time to trip, before disconnection of the transformer 4 is necessary. The analysis 108A may also include determining the rate at which the temperature varies, rises or falls, for a given power level of the load profile at the present state of the transformer 4. Thus, the determining 109 of the power schedule is based on the power balance, at present time and into the future, and the temperature profile of the transformer.

The method subsequently includes controlling the power in the microgrid by applying 110 the power schedule and control the equipment in accordance with the power control schedule.

However, it is preferred that the method includes seeking to optimize the overloading of the transformer and therefore repeats 109 the steps for determining a power control schedule. Thus, the power control schedule determined is used for determining 106n an updated load profile, which updated load profile is used for determining 107n an updated temperature profile of the transformer 4, and which temperature profile is used to determine 108n an updated power control schedule for the microgrid 1. During the optimization 109, the method may suitably comprise maximizing the power transfer through the transformer while avoiding overheating of the transformer 4. The method should also repeat the step of detecting 103 whether there is a need for overloading and the method may be interrupted when overloading is not needed. During the optimization 109, the method may also employ a set of rules including prioritizing between actions to be taken in the microgrid 1 when planning for the power control schedule, such as avoiding storing energy when power transfer through the transformer is possible, and avoiding load shedding when power injections from the energy storage is possible.

The method includes repeatedly applying 110 an updated power schedule, also when the current power schedule has not ended.

The power transfer through the transformer, and/or the load profile for the transformer 4 may be used for controlling the cooling of the transformer 4, in order to take cooling action anticipating an increasing transformer temperature or hot spots temperature. Preferably, the method includes controlling 111 the cooling system of the transformer 4 on the basis of the load profile for the transformer 4. This controlling 11 will thus for example regulate the cooling in advance of a change of power through the transformer 4, e.g. when a temperature rise is forecasted or anticipated.

Figure 3:
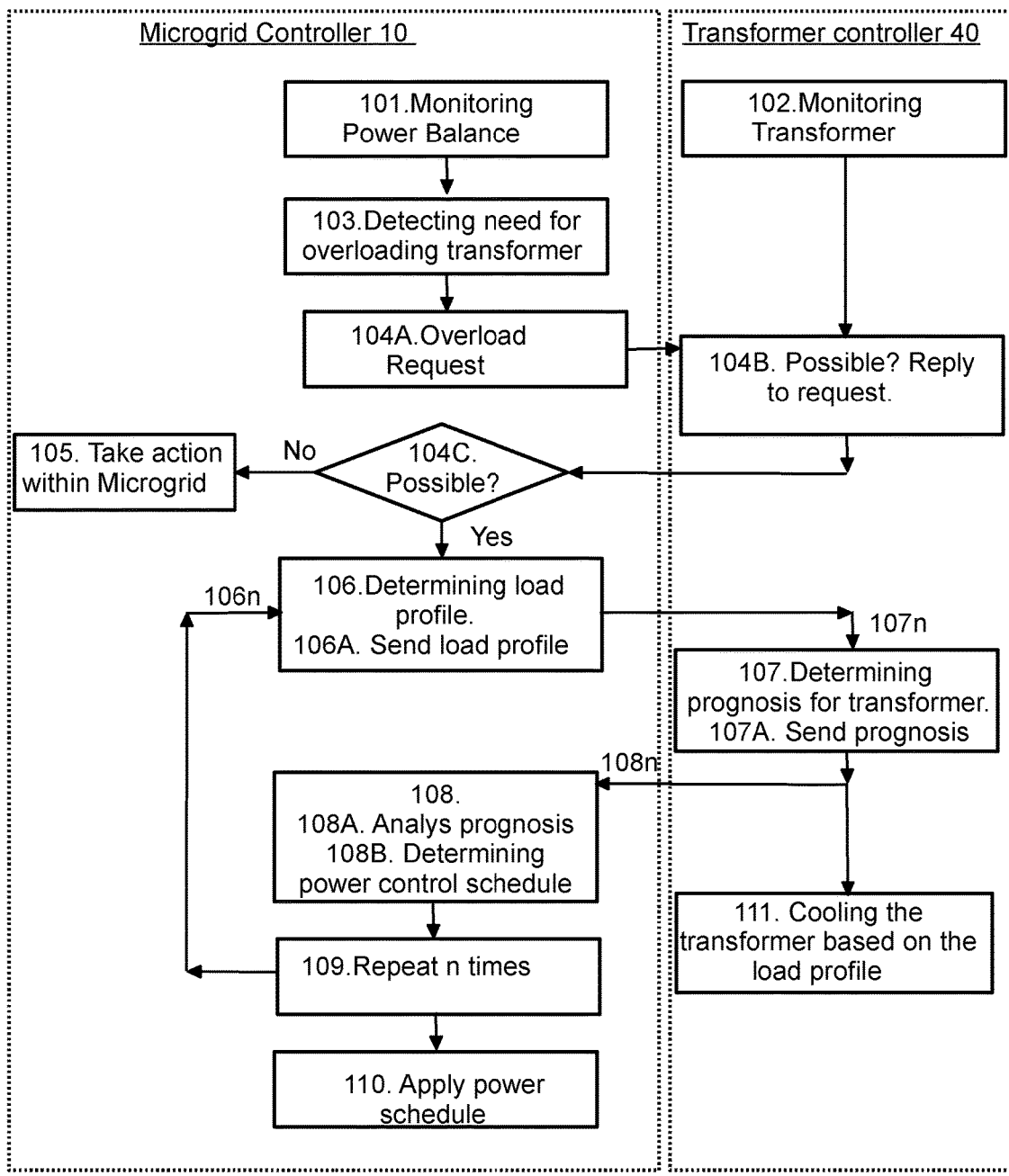
FIG. 3 illustrates a method for controlling power in a microgrid according to a second embodiment.

FIG. 3 illustrates an embodiment for controlling the power in a microgrid 1 wherein the method steps are shared between the microgrid controller 10 and the transformer controller/monitor unit 40 in a suitable way.

The microgrid controller 10 performs the steps of monitoring 101 the power balance within the microgrid, detecting 103 a need for overloading the transformer 4, determining 106 a load profile for the transformer 4, determining 108 a power control schedule, and applying 110 the power control schedule when controlling the microgrid.

The transformer controller 40 performs the monitoring 102 of the transformer 4 and the determining 107 of a prognosis of the transformer temperature.

The step of determining 104 whether overloading is possible is performed by the microgrid controller 10 sending 104A an overload request to the transformer controller 40, which transformer controller 40, in view 1046 of the status and needed power level of the transformer 4, as monitored, replies 104C to the request.

In this embodiment, the step of determining 106 a load profile for the transformer includes sending 106A the load profile to the transformer controller 40, and the step of determining 107 a prognosis of the transformer temperature includes sending 107A the prognosis, or temperature profile, to the microgrid controller 10.

The embodiment of FIG. 3 may be performed in accordance with the microgrid controller 10 and transformer controller 40 illustrated in FIG. 1, wherein the transformer overloading controller 12:

determines 108 the power control schedule, and handles the communication with the transformer controller 40, and wherein the power balance controller 11:

monitors 101 the power balance, and the power sources 3, loads 5, and energy storage 6, of the microgrid 1;

take action 105 when overload is not possible;

determines 102 a need for overloading;

provides 106 a load profile for the transfer through the transformer 4; and controls the microgrid by applying 110 the power control schedule.

The power balance controller 11 may for example provide a need (103) for overload to the overload controller 12, which overload controller sends 104 the overload request and receives the reply from the transformer controller 40. The overload controller 12 may also request (not illustrated) load profiles from the power balance controller 11 and send the load profiles to the transformer controller 4.

The transformer controller 40 may also control 111 cooling of the transformer 4 on the basis of the load profile, for example the transformer controller 40 may increase the cooling power when the load profile indicates increasing power levels in the future, even if the current temperature of the transformer 4 is comparatively low.

A method 100, and a control system comprising a controller 10 and a transformer controller 40, for controlling power in a microgrid 1 that comprises power sources 3, loads 5 and at least one connection to a main grid 2 where a transformer 4 is arranged to transfer electric power between the microgrid 1 and the main grid 2 has been described in embodiments. The method comprises: monitoring 101 the power balance within the microgrid 1; monitoring 102 the transformer 4, including monitoring the transformer temperature; and detecting 103 a need for overloading the transformer 4 based on the power balance within the microgrid 1.

Especially, the method comprises: determining 106 a load profile for the transformer 4 based on the power balance within the microgrid 1; determining a prognosis 107 of the transformer temperature based on the load profile; and determining 108 a schedule for power control of the microgrid 1. The schedule for power control includes analyzing 108A the prognosis of the transformer temperature, and is provided in view of the power balance and the prognosis of the transformer temperature. The invention is however not limited to these embodiments, but may be varied within the scope of the claims.

The invention claimed is:

1. A method for controlling power in a microgrid, wherein the microgrid comprises power sources, loads and includes at least one connection to a main grid where a transformer is arranged to transfer electric power between the microgrid and the main grid, said method includes:
   monitoring the power balance within the microgrid,
   monitoring the transformer, including monitoring the transformer temperature,
   detecting a need for overloading the transformer based on the power balance within the microgrid,
   determining a load profile for the transformer based on the power balance within the microgrid,
   determining a prognosis of the transformer temperature based on the load profile, and
   determining a schedule for power control of the microgrid, wherein the determining of a schedule for power control includes analyzing the prognosis of the transformer temperature.

2. The method for controlling power in a microgrid according to claim 1, further including:
   performing an optimization of the schedule for power control by repeatedly:
   determining an updated load profile for the transformer based on the schedule for power control,
   determining an updated prognosis of the transformer temperature based on the load profile, and
   determining an updated schedule of power control.

3. The method for controlling power in a microgrid according to claim 2, wherein the optimization of the schedule for power control includes seeking a power control schedule that
   a) maximizes the power transfer through the transformer,
   b) avoids tripping the transformer, and
   c) avoid power imbalance within the microgrid while controlling the system voltage and frequency.

4. The method for controlling power in a microgrid according to claim 2, wherein the optimization of the schedule for power control includes prioritizing storing of energy in energy storages in relation to decreasing power production, and includes prioritizing decreasing power production in relation to tripping the transformer.

5. The method for controlling power in a microgrid according to claim 1, wherein the monitoring of the transformer includes monitoring the cooling of the transformer, such as status of cooling equipment, available cooling power of cooling equipment and surrounding temperature of the transformer, and possibly also a forecast for the surrounding temperature.

6. The method for controlling power in a microgrid according to claim 1, wherein the prognosis of the transformer temperature includes a time left before reaching a tripping condition of the transformer, or wherein the analyzing of temperature prognosis, includes identifying a time left before reaching a tripping condition of the transformer.

7. The method for controlling power in a microgrid according to claim 1, further including determining if overloading is possible before determining a schedule for power control.

8. The method for controlling power in a microgrid according to claim 7, wherein the determining if overloading is possible includes sending an initial request for overloading to the transformer controller and receiving an acknowledgement from the transformer controller.

9. The method for controlling power in a microgrid according to claim 1, further including controlling cooling of the transformer based on:
   the level of power transferred through the transformer, or
   the load profile.

10. A microgrid controller, for controlling power in a microgrid that includes power sources, loads and includes at least one connection to a main grid where a transformer is arranged to transfer electric power between the microgrid and the main grid, wherein the controller is configured to:
    monitor the power balance of the microgrid,
    detect a need for overloading the transformer based on the power balance of the microgrid,
    determine a load profile for the transformer based on the power balance of the microgrid,
    obtain a prognosis of the transformer temperature based on the load profile,
    analyze the prognosis of the transformer temperature to determine a schedule for power control of the microgrid, and
    control the power supply from the power sources and power supplied to the loads in accordance with the power control schedule.

11. The microgrid controller according to claim 10, further configured to optimize the schedule for power control by repeatedly:
    determine an updated load profile for the transformer based on the schedule for power control,
    determine an updated prognosis of the transformer temperature based on the load profile, and
    use the updated prognosis of the transformer temperature to update the schedule of power control.

12. A control system for controlling power in a microgrid, including a microgrid controller and a transformer controller, and which control system is configured to perform the method including:

monitoring the power balance within the microgrid,
monitoring the transformer, including monitoring the transformer temperature,
detecting a need for overloading the transformer based on the power balance within the microgrid,
determining a load profile for the transformer based on the power balance within the microgrid,
determining a prognosis of the transformer temperature based on the load profile, and
determining a schedule for power control of the microgrid, wherein the determining of a schedule for power control includes analyzing the prognosis of the transformer temperature.

13. The method for controlling power in a microgrid according to claim 3, wherein the optimization of the schedule for power control includes prioritizing storing of energy in energy storages in relation to decreasing power production, and includes prioritizing decreasing power production in relation to tripping the transformer.

14. The method for controlling power in a microgrid according to claim 2, wherein the monitoring of the transformer includes monitoring the cooling of the transformer, such as status of cooling equipment, available cooling power of cooling equipment and surrounding temperature of the transformer, and possibly also a forecast for the surrounding temperature.

15. The method for controlling power in a microgrid according to claim 2, wherein the prognosis of the transformer temperature includes a time left before reaching a tripping condition of the transformer, or wherein the analyzing of temperature prognosis, includes identifying a time left before reaching a tripping condition of the transformer.

16. The method for controlling power in a microgrid according to claim 2, further including determining if overloading is possible before determining a schedule for power control.

17. The method for controlling power in a microgrid according to claim 2, further including controlling cooling of the transformer based on:
the level of power transferred through the transformer, or
the load profile.

* * * * *